United States Patent
Vangheluwe et al.

(10) Patent No.: US 8,435,593 B2
(45) Date of Patent: May 7, 2013

(54) METHOD OF INSPECTING A SUBSTRATE AND METHOD OF PREPARING A SUBSTRATE FOR LITHOGRAPHY

(75) Inventors: Rik Teodoor Vangheluwe, Bergeijk (NL); Youri Johannes Laurentius Maria Van Dommelen, Ballston Lake, NY (US); Johannes Anna Quaedackers, Veldhoven (NL); Cédric Désiré Grouwstra, Eindhoven (NL); Thijs Egidius Johannes Knaapen, HD Beek en Donk (NL); Ralf Martinus Marinus Daverveld, EL Sint-Oedenrode (NL); Jeroen Hubert Rommers, Lommel (BE)

(73) Assignee: ASML Netherlands B.V., Veldhoven (NL)

( * ) Notice: Subject to any disclaimer, the term of this patent is extended or adjusted under 35 U.S.C. 154(b) by 1457 days.

(21) Appl. No.: 11/802,422

(22) Filed: May 22, 2007

(65) Prior Publication Data

US 2008/0292780 A1   Nov. 27, 2008

(51) Int. Cl.
*C23C 16/52* (2006.01)
(52) U.S. Cl.
USPC ........... 427/8; 356/300; 356/399; 356/400; 356/401; 438/14; 438/16
(58) Field of Classification Search ........ 427/8; 355/53; 356/237.2, 237.4, 237.5, 124, 369, 400, 401, 356/580; 438/14, 16
See application file for complete search history.

(56) References Cited

U.S. PATENT DOCUMENTS

| | | | |
|---|---|---|---|
| 4,509,852 A | 4/1985 | Tabarelli et al. | 355/30 |
| 4,898,471 A | 2/1990 | Vaught et al. | 356/394 |
| 7,142,300 B2 | 11/2006 | Rosengaus | |
| 7,423,728 B2 | 9/2008 | Matsunaga et al. | |
| 7,630,053 B2 | 12/2009 | Kawamura | |
| 7,733,472 B2 | 6/2010 | Yamamoto et al. | |
| 2003/0044702 A1* | 3/2003 | Schulz | 430/30 |
| 2004/0136494 A1 | 7/2004 | Lof et al. | 378/34 |
| 2004/0207824 A1 | 10/2004 | Lof et al. | 355/30 |
| 2005/0007570 A1* | 1/2005 | Streefkerk et al. | 355/53 |

(Continued)

FOREIGN PATENT DOCUMENTS

| EP | 1 420 300 A2 | 5/2004 |
|---|---|---|
| EP | 1 420 300 A3 | 8/2005 |

(Continued)

OTHER PUBLICATIONS

Tuan Le, Monitoring Immersion-Based Wafer-Edge Defects, Rudolph Technologies, USA, Apr. 2007, pp. 1-4.

(Continued)

*Primary Examiner* — Nathan Empie
*Assistant Examiner* — Xiao Zhao
(74) *Attorney, Agent, or Firm* — Pillsbury Winthrop Shaw Pittman LLP (57) ABSTRACT

A method of inspecting a substrate with first and second layers thereon is disclosed. The method includes directing a beam of electromagnetic radiation at an acute angle towards an edge of the layers, detecting scattered and/or reflected electromagnetic radiation, and establishing, from results of the detecting, whether an edge of the second layer overlaps an edge of the first layer.

20 Claims, 8 Drawing Sheets

U.S. PATENT DOCUMENTS

| | | |
|---|---|---|
| 2005/0018190 A1* | 1/2005 | Sezginer et al. ............... 356/401 |
| 2005/0037272 A1 | 2/2005 | Tanaka |
| 2006/0160029 A1* | 7/2006 | Dirksen et al. ................. 430/312 |
| 2007/0252960 A1 | 11/2007 | Kida |
| 2009/0033890 A1 | 2/2009 | Fujiwara et al. |
| 2010/0073647 A1 | 3/2010 | Kyouda et al. |

FOREIGN PATENT DOCUMENTS

| | | |
|---|---|---|
| EP | 1607738 A1 | 12/2005 |
| JP | 2002-134575 A | 5/2002 |
| JP | 2002-141274 A | 5/2002 |
| JP | 2005-033177 A | 2/2005 |
| JP | 2005-222284 A | 8/2005 |
| JP | 2006-005360 A | 1/2006 |
| JP | 2006-186112 A | 7/2006 |
| JP | 2006-189687 A | 7/2006 |
| JP | 2006-190997 A | 7/2006 |
| JP | 2006-319217 A | 11/2006 |
| JP | 2007-013162 | 1/2007 |
| JP | 2007-266074 A | 10/2007 |
| JP | 2007-288108 A | 11/2007 |
| JP | 2008-047612 A | 2/2008 |
| JP | 2008-135582 A | 6/2008 |
| JP | 2006-049630 A | 4/2011 |
| WO | WO 99/49504 | 9/1999 |
| WO | 03/077291 A | 9/2003 |
| WO | 2007/001045 | 1/2007 |

OTHER PUBLICATIONS

Office Action in related Japanese Application No. JP2008-132283 mailed Jan. 27, 2011.

Japanese Office Action mailed Jun. 18, 2012 in corresponding Japanese Patent Application No. 2008-132283.

* cited by examiner

METHOD OF INSPECTING A SUBSTRATE AND METHOD OF PREPARING A SUBSTRATE FOR LITHOGRAPHY

FIELD

The present invention relates to a method of inspecting a substrate and a method of preparing a substrate for lithography. In particular an embodiment of the present invention relates to a method to inspect and/or monitor the edge bead removal (EBR) process. An embodiment of the invention also relates to using feedback to optimize a coating track.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

Figure 2:
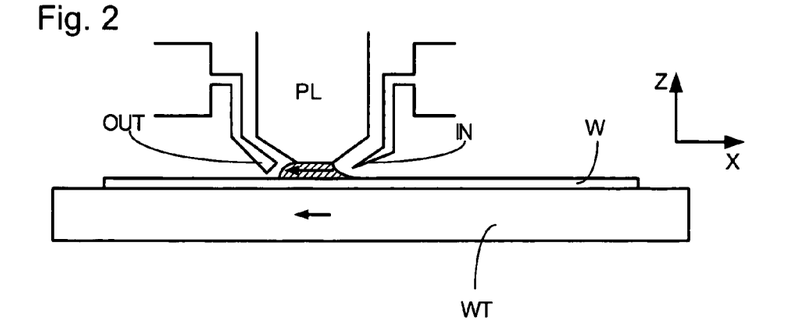
FIGS. 2 and 3 depict a liquid supply system for use in a lithographic projection apparatus.
Figure 3:
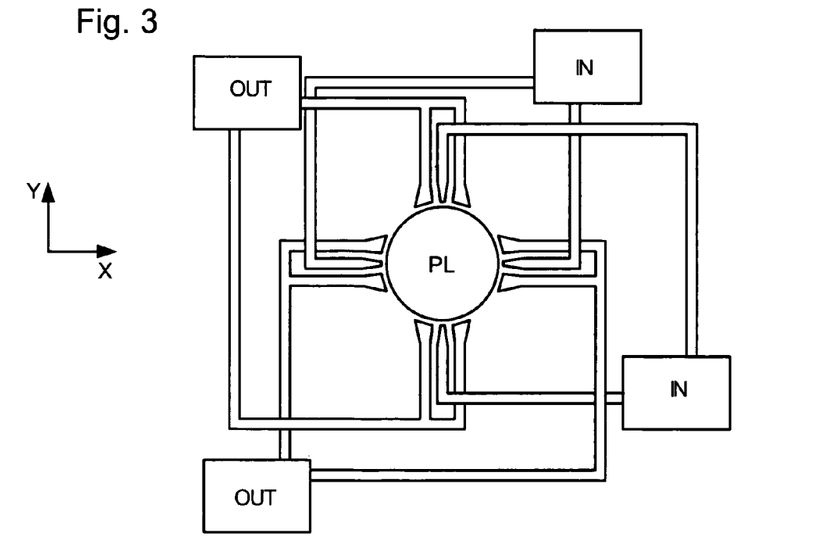

One of the solutions proposed is for a liquid supply system to provide liquid on only a localized area of the substrate and in between the final element of the projection system and the substrate using a liquid confinement system IH (the substrate generally has a larger surface area than the final element of the projection system). One way which has been proposed to arrange for this is disclosed in PCT patent application publication no. WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

Figure 4:
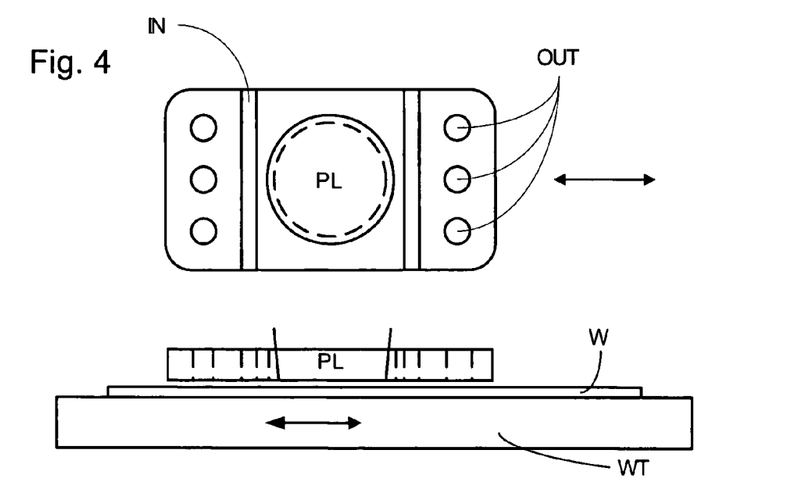
FIG. 4 depicts a further liquid supply system for use in a lithographic projection apparatus.

A further immersion lithography solution with a localized liquid supply system IH is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Figure 5:
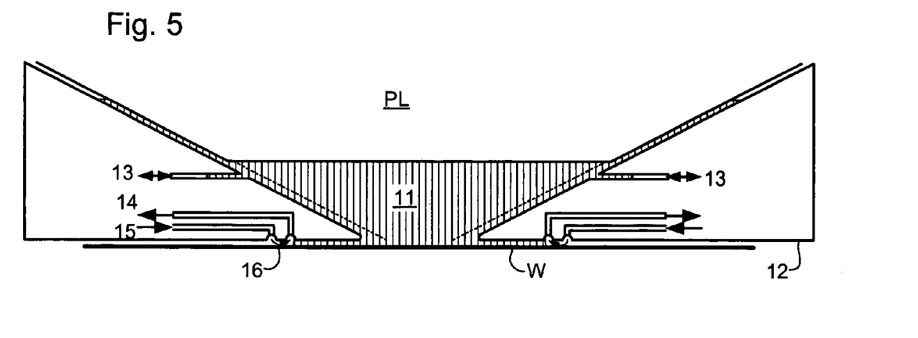
FIG. 5 depicts a further liquid supply system for use in a lithographic projection apparatus.

Another immersion lithography solution with a localized liquid supply system solution which has been proposed is to provide the liquid supply system with a liquid confinement structure IH which extends along at least a part of a boundary of the space between the final element of the projection system and the substrate table. Such a solution is illustrated in FIG. 5. The liquid confinement structure is substantially stationary relative to the projection system in the XY plane though there may be some relative movement in the Z direction (in the direction of the optical axis). In an embodiment, a seal is formed between the liquid confinement structure and the surface of the substrate and may be a contactless seal such as a gas seal.

The liquid confinement structure 12 at least partly contains liquid in the space 11 between a final element of the projection system PL and the substrate W. A contactless seal 16 to the substrate may be formed around the image field of the projection system so that liquid is confined within the space between the substrate surface and the final element of the projection system. The space is at least partly formed by the liquid confinement structure 12 positioned below and surrounding the final element of the projection system PL. Liquid is brought into the space below the projection system and within the liquid confinement structure 12 by liquid inlet 13 and may be removed by liquid outlet 13. The liquid confinement structure 12 may extend a little above the final element of the projection system and the liquid level rises above the final element so that a buffer of liquid is provided. The liquid confinement structure 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The liquid is contained in the space 11 by a gas seal 16 which, during use, is formed between the bottom of the liquid confinement structure 12 and the surface of the substrate W. The gas seal is formed by gas, e.g. air or synthetic air but, in an embodiment, N₂ or another inert gas, provided under pressure via inlet 15 to the gap between liquid confinement structure 12 and substrate and extracted via outlet 14. The overpressure on the gas inlet 15, vacuum level on the outlet 14 and geometry of the gap are arranged so that there is a high-velocity gas flow inwards that confines the liquid. Those inlets/outlets may be annular grooves which surround the space 11 and the flow of gas 16 is effective to contain the liquid in the space 11. Such a system is disclosed in United States patent application publication no. US 2004-0207824, hereby incorporated in its entirety by reference.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

Contamination of immersion liquid and components such as a substrate table and a liquid supply device in an immersion lithography apparatus can be a particular problem. Any source of such contamination is to be minimized.

SUMMARY

It is desirable to reduce the risk of contamination of immersion liquid and components of the apparatus.

According to an aspect of the invention, there is provided an inspection method comprising:
  directing a beam of electromagnetic radiation over substantially the whole top surface of a substrate covered in first and second layers thereon and towards an edge of the layers;
  detecting scattered and/or reflected electromagnetic radiation; and
  establishing, from results of the detecting, whether an edge of the second layer overlaps an edge of the first layer.

According to an aspect of the invention, there is provided a method of preparing a substrate for lithography, the method comprising:
  first applying of a first coating to the substrate;
  second applying of a second coating to the substrate;
  scanning or stepping a beam of electromagnetic radiation over substantially the whole top surface of the substrate covered in the first or second coating and along an edge of the first and/or second coating;
  detecting radiation reflected and/or scattered by the edge of the first coating and by the edge of the second coating; and
  from the detected radiation, establishing whether or not the edge of the first coating and the edge of the second coating overlap.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
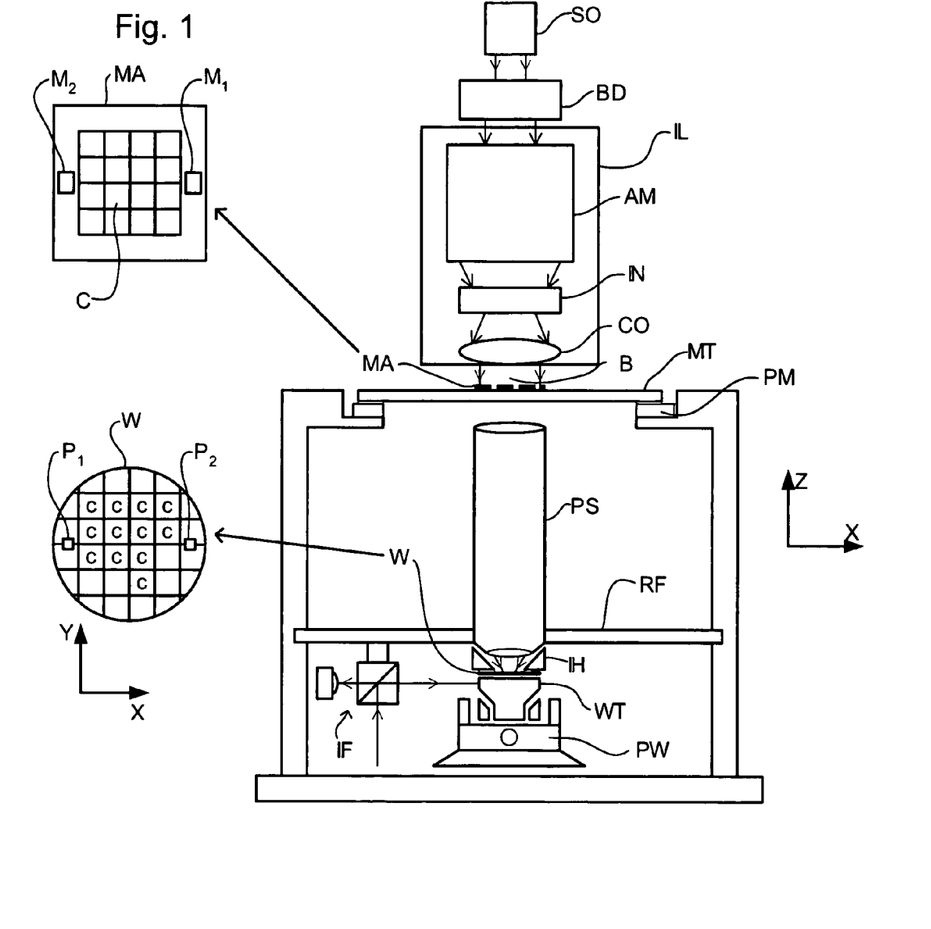
FIG. 1 depicts a lithographic apparatus according to an embodiment of the invention.

FIG. 1 schematically depicts a lithographic apparatus according to one embodiment of the invention. The apparatus comprises:
  an illumination system (illuminator) IL configured to condition a radiation beam B (e.g. UV radiation or DUV radiation);
  a support structure (e.g. a mask table) MT constructed to support a patterning device (e.g. a mask) MA and connected to a first positioner PM configured to accurately position the patterning device in accordance with certain parameters;
  a substrate table (e.g. a wafer table) WT constructed to hold a substrate (e.g. a resist-coated wafer) W and connected to a second positioner PW configured to accurately position the substrate in accordance with certain parameters; and
  a projection system (e.g. a refractive projection lens system) PS configured to project a pattern imparted to the radiation beam B by patterning device MA onto a target portion C (e.g. comprising one or more dies) of the substrate W, the projection system held by a frame RF.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AM for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B.

Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

A resist and/or topcoat has poor adhesion on a silicon substrate. In contrast, a bottom anti-reflection coating (BARC) has excellent adhesion on a silicon substrate. If the resist layer and/or topcoat layer extends over the BARC layer onto the substrate, peeling of the resist and/or topcoat layer may occur on exposure to the immersion liquid thereby contaminating the immersion liquid. Contamination in the immersion liquid may then deleteriously affect the imaging of all subsequent substrates. Thus, it is desirable to ensure that not even a single substrate in a batch has a resist and/or topcoat extending over the BARC layer. Therefore it is desirable to inspect and monitor the substrates to avoid such problems.

Figure 6:
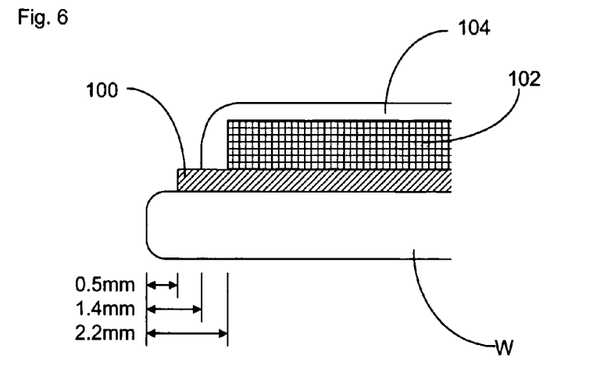
FIG. 6 depicts, in cross-section, a substrate with three coatings thereon.

FIG. 6 shows the edge of a substrate in which neither the resist nor the topcoat overlap the edge of the BARC layer.

In FIG. 6, a BARC layer 100 is first coated on the substrate W. The BARC layer 100 has an edge which extends close to the edge of the substrate. Ideally the gap between the edge of the substrate and the edge of the BARC layer is approximately 0.5 mm (manufacturers prefer below 1.0 mm). The substrate is conventionally circular (although it need not be). This, or other layers, may be spin coated on the substrate.

On top of the BARC layer 100 there is formed a resist layer 102. The resist layer 102 ideally has an edge which is situated radially inwardly, relative to the center of the substrate, of the edge of the BARC layer 100. Desirably the edge of the resist layer is about 2.2 mm from the edge of the substrate. On top of the resist layer is an optional topcoat layer 104. This layer is coated after the resist 102 layer has been deposited. As can be seen, the topcoat layer 104 covers the whole of the resist layer 102 as well as the edge of the resist layer 102 such that part of the topcoat layer 104 is deposited on top of the BARC layer 100. An edge of the topcoat layer 104 lies, radially, between the edge of the BARC layer 100 and the edge of the resist layer 102 and desirably about 1.4 mm from the edge of the substrate W. Alternative arrangements are possible, so long as the topcoat and/or resist do not land onto the uncoated substrate and that the gap to the edge of the substrate is small (as small as possible). To achieve this back and/or top side rinse with solvent may be used. All EBR strategies may be used in the embodiments of the present invention.

One way which may be used to check that neither the topcoat 104 nor the resist 102 overlaps the BARC layer 100 is to check visually with a microscope. This check may be performed at a certain number of positions over the substrate to determine that the edges of the layers are in the correct order. If this is done at four locations around the periphery of the substrate W with circular layers 100, 102, 104, each location separated from the neighboring location by 90°, it is possible to see that at those four locations there is no unallowable overlap but at a location between two of those points there could be. If the layers are not perfectly circular, it would of course be possible for there to be areas in which the overlap is not correct between each of the four positions at which measurements take place.

Figure 7:
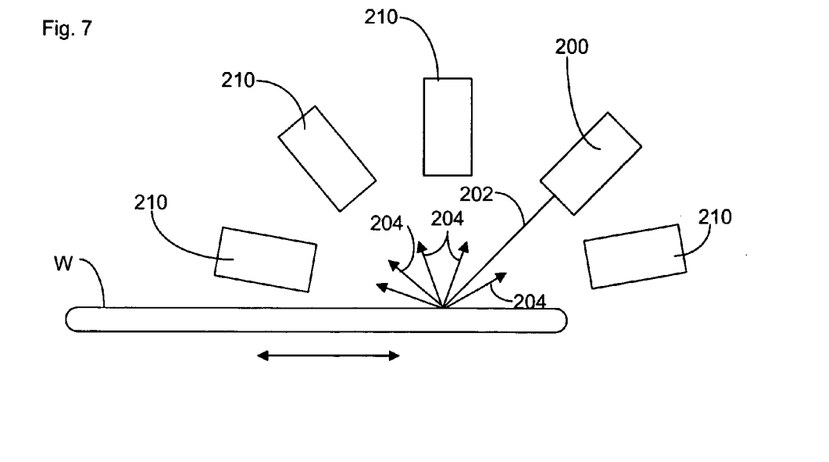
FIG. 7 depicts an inspection apparatus.

FIG. 7 illustrates, in cross-section, an un-patterned defectivity tool (for example a KLA-Tencor Surfscan SP1 or Surfscan SP2 inspection system) in which a focused beam of radiation 202 produced by an illuminator 200 is directed onto the top surface of the substrate at an acute angle i.e. at an angle between parallel and perpendicular to the top surface of the substrate W. That radiation may be polarized or may not be polarized. The radiation 204 which is reflected and/or scattered by the surface is picked up by a plurality of detectors 210. From the information received by the detectors 210 defects in the top surface of the substrate W can be detected. The beam and/or substrate W is scanned such that all of the top surface of the substrate is at some point under the illumination beam 202. Alternatively, the beam and/or substrate W can be stepped to cover across the top surface of the substrate. The illumination beam typically has a diameter of between 5 and 15 microns in width. Any tooling that is based on scatterometry can be used. Tooling alternatively or additionally using phase shift and/or reflection could also be used. These other types of tooling may be particularly suited to detecting an edge of the layers when the edge is on the bevelled edge of the substrate. In such circumstances, a combination of different techniques could be used.

Bright field or dark field illumination can be used as well as a combination of angles of radiation beam and/or sensor to the substrate surface.

The measurement of the edge is desirably made concurrently with the measurement of some other feature of the substrate in the present application (thus scanning over substantially the whole surface of the substrate). For example, measurement of defects, measurement of the surface profile of the substrate, etc.

Normally the type of the un-patterned defectivity tool illustrated in FIG. 7 is used to detect imperfections on the base silicon substrate and/or in the BARC, resist and/or topcoat layers prior to and/or after the substrate W has exited a processing track where those layers are applied to the top surface of the substrate W. After the substrate has been checked and the level of defects are found to be acceptable, the substrate then moves into the lithography apparatus such as that illustrated in FIG. 1. However, this may not necessarily be the case and the un-patterned defectivity tool illustrated in FIG. 7 could be in the processing track or just before the lithography apparatus of FIG. 1 to make sure all or most mis-processed substrates are detected before they enter the lithography apparatus.

One such un-patterned inspection tool is described in U.S. Pat. No. 4,898,471. In that tool, the area illuminated on a substrate surface by a scanning beam is an ellipse which moves in the scan direction. In one example given in U.S. Pat. No. 4,898,471, the ellipse has a width of 20 microns and a length of 115 microns. Radiation scattered by anomalies or patterns in that illuminated area is detected by photodetectors placed at azimuthal angles in the range of 80° to 100°. The signals detected by the photodetectors are used to construct templates. When the elliptical spot is moved in the scan direction to a neighboring position, scattered radiation from structures within the spot is again detected and the photodetector signal is then compared to the template to ascertain the presence of contaminant particles or pattern defects as opposed to a regular pattern. In U.S. Pat. No. 4,898,471, the scanning beam scans across the entire substrate to illuminate and inspect a long narrow strip of the substrate extending across the entire dimension of the substrate in the scanning direction. The substrate is then moved by a mechanical stage in a direction perpendicular to the scanning direction for scanning a neighboring elongated strip. This operation is then repeated until the entire substrate is covered.

Radiation scattered from structures in the spot will include background, such as radiation scattered by a pattern on the surface, as well as radiation that is scattered by anomalies such as contaminant particles, pattern defects or imperfections of the surface. Such background can have a significant amplitude. For this reason, if the anomaly is of a size which is small compared to the size of the illuminated area, the scattered radiation from such anomaly may be overwhelmed by and become undetectable from the background. By reducing the size of the illuminated area or spot size, the ratio of the radiation intensity scattered by an anomaly to that of the background will be increased, thereby increasing detection sensitivity. However, with a smaller spot size, it will be more difficult to maintain the uniformity of the spot along a long straight scan line across the entire substrate. By breaking up the scan path into short segments, it is possible to employ a smaller spot size while at the same time maintaining uniformity of the spot along the path. From the system point of view, by reducing the length of the scan, the size of the collection optics to detect forward scattered radiation becomes more manageable.

Normally the apparatus illustrated in FIG. 7 only detects a central area of the top surface of the substrate and the edge area is not detected because devices are not usually imaged onto that part of the device so that it does not matter if there are defects in that area. However, in an embodiment of the present invention, the edge of the substrate W is scanned with the illumination beam 202 and the above-referenced type of un-patterned defectivity tool can be used to image the position of the edge of the BARC layer 100, the edge of the resist layer 102 and the edge of the optional topcoat layer 104. Analysis of the edge can then be used to determine whether or not those edges overlap each other. Scanning the edge takes little extra time so that combining scanning of the edge with scanning for defects is efficient. An embodiment of how this can be done is illustrated below.

An embodiment of the invention also applies to patterned defectivity tools. Suitable tools include the KLA 2xxx series inspection system (e.g., the KLA-2351, 2365 or 2800 inspection systems).

In an embodiment, a level sensor of a metrology station in a lithographic apparatus may be used to not only scan (or step over) the top surface of the substrate to measure height variations as part of the pre-processing of the substrate, but may also be used to scan over at least part of the edge of the layers. In a level sensor the beam impinges on the substrate at substantially 90° to the plane of the top surface of the substrate. These height scan measurements at the edge of the layers then reveal information about the position of the edge of the layers, in particular the step height change between the optional top coat layer 104 and the BARC layer 100 or the resist layer 102 and the BARC layer 100, and between the BARC layer 100 and the substrate W itself (see FIG. 6). Thus, in this way by extending marginally the area over which the level sensor steps or scans in order to produce the so called substrate height map (which is a map of the top surface of the substrate containing comparative height measurements and which is used to help in focusing during imaging), details of the edge of the layers can be obtained without having to perform a separate measurement step. The data obtained in this way can then be used in exactly the same way as the data of any other embodiment.

A further embodiment is a (high resolution) CCD camera to scan over the whole surface. In fact, a beam can simply be directed over substantially the whole top surface of the substrate, including an edge of the layers. It can be moved, for example by scanning and/or stepping.

Figure 8:
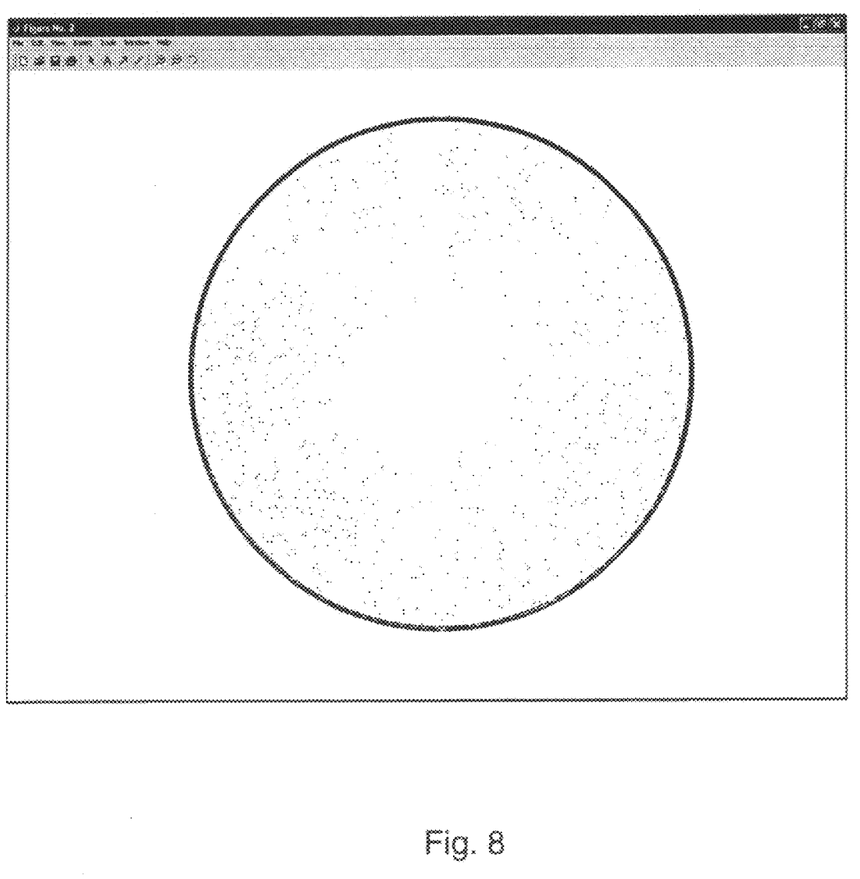
FIGS. 8 and 9 depict artifacts detected by the inspection apparatus of FIG. 7.
Figure 9:
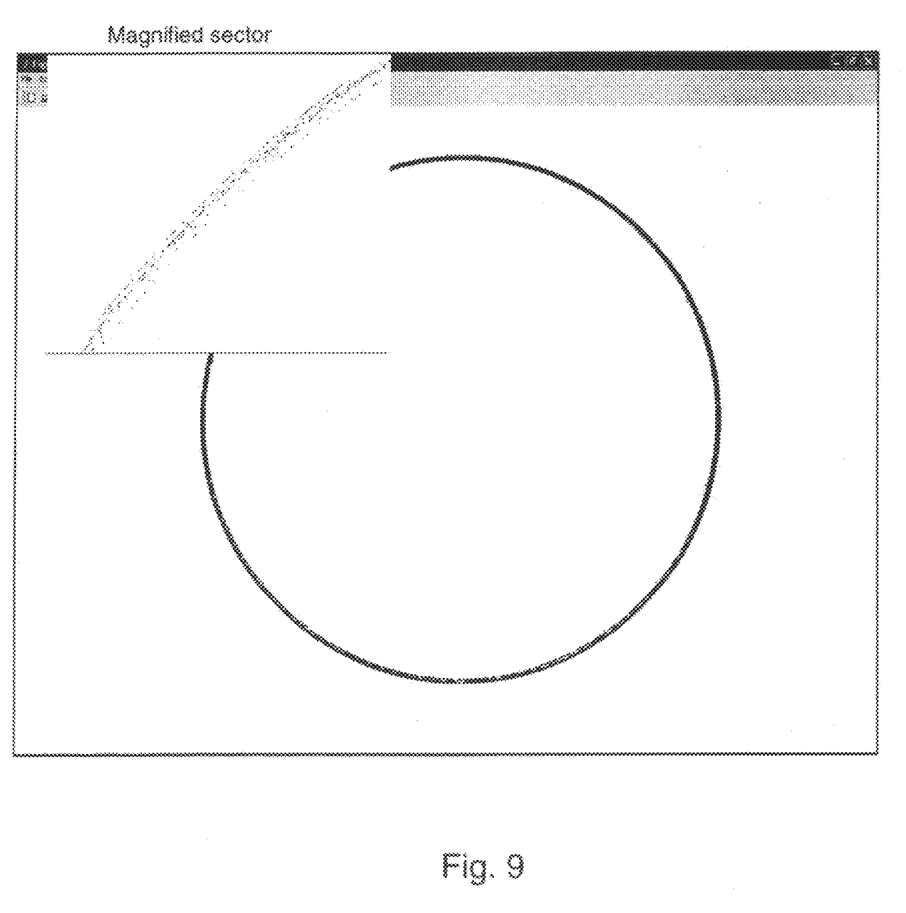
Figure 10:
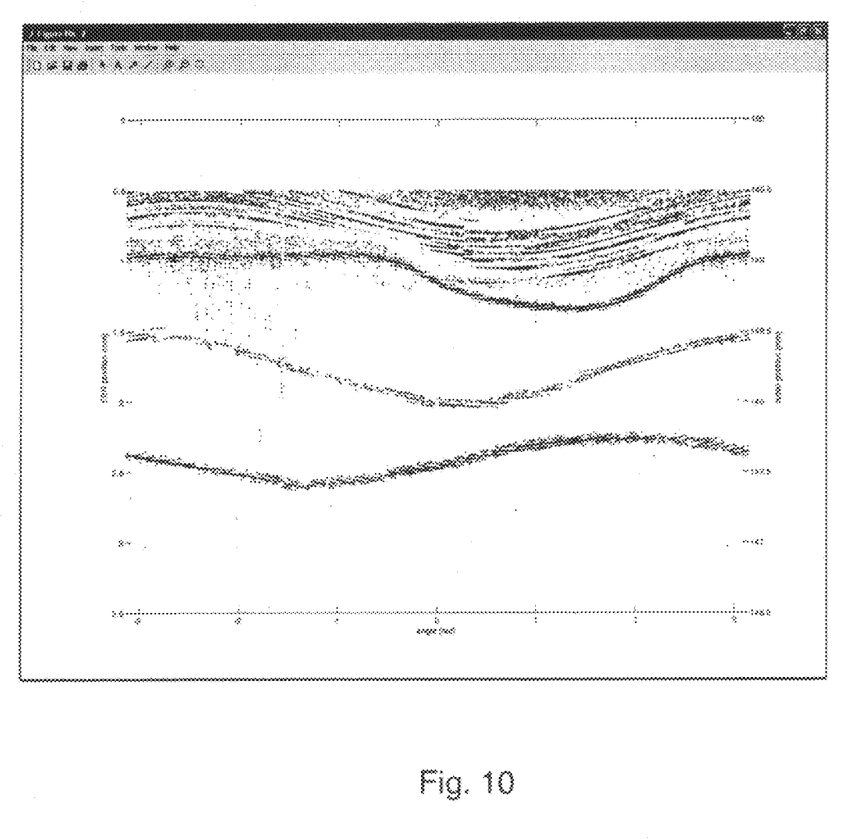
FIG. 10 depicts raw data which has been manipulated to polar co-ordinates.

FIG. 8 illustrates the result of analysis of a substrate. Mainly indicated in the analysis are many surface defects which show up as readings in the middle of the substrate (this is more surface defects than usual). Normal analysis can be carried out of those surface defects and the substrate can be rejected or accepted as usual. However, in a further or alternative step, which is in accordance with an embodiment of the present invention, the illumination beam 202 is scanned over the edge of the substrate such that, as illustrated in FIG. 9, the edges of the BARC 100, resist 102 and topcoat 104 layers can be seen. An easy way of processing this data is to plot it in polar coordinates and this is illustrated in FIG. 10 for a substrate which passes the test. In FIG. 10 there are three sets of data which can be seen, the top most data is the edge of the substrate, next is the edge of the BARC layer 100, next the edge of the topcoat layer 104 and finally the edge of the resist layer 102. Any overlap in these lines or lines in the wrong order could lead to rejection of the substrate. Although it is easy visually to inspect results illustrated in FIG. 10 and determine that the substrate passes the test, it can be beneficial to fit a curve to the data to allow automatic analysis. On suitable equation to fit to the data is of the form:

$$r = a + b\sin(\phi) + c\cos(\phi)$$

where r is displacement from the origin and a, b and c are constants and $\phi$ is the angular position in polar coordinates.

Figure 11:
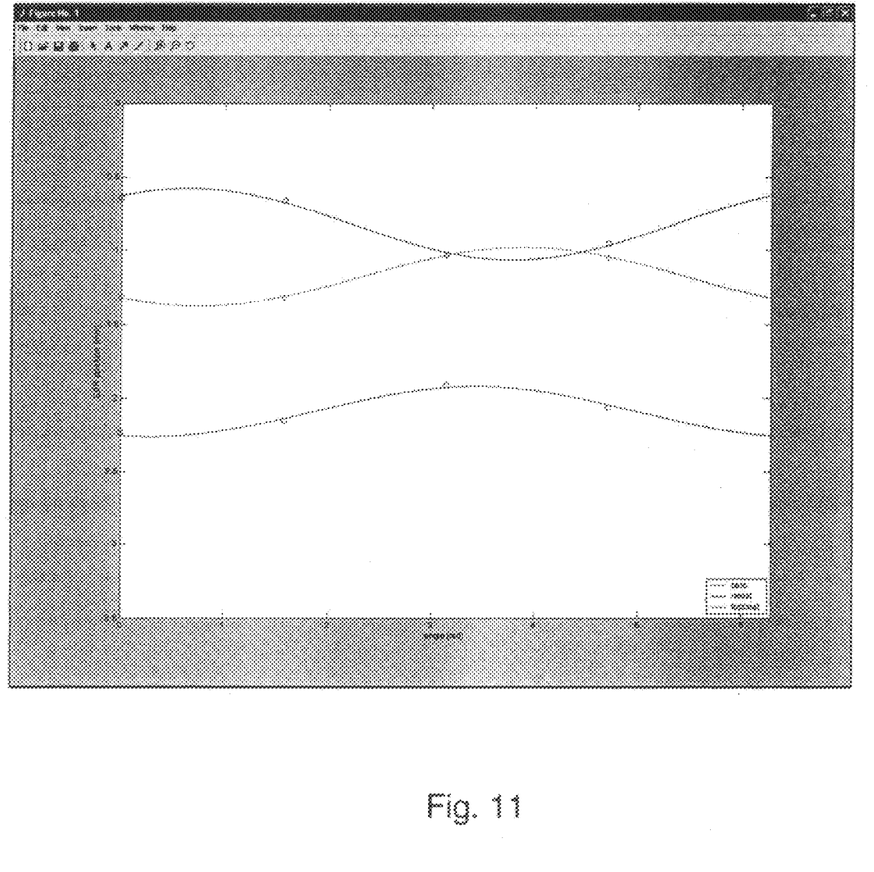
FIGS. 11 and 12 depict curves fitted to typical data.
Figure 12:
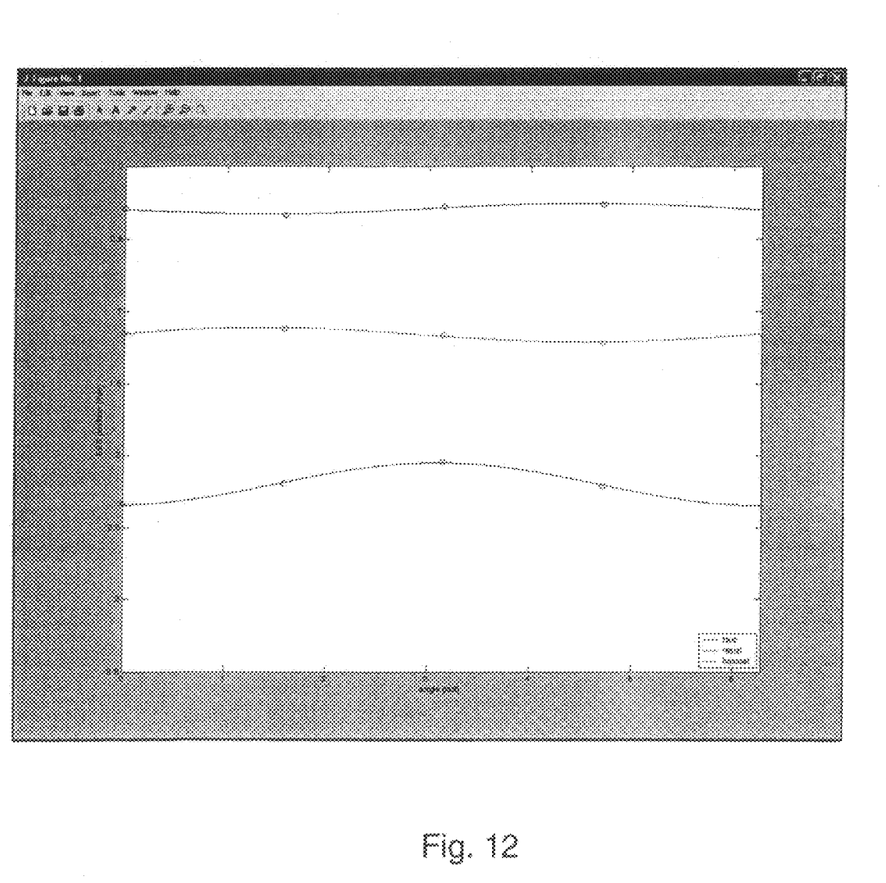

FIG. 11 shows one typical result in which the edge of the BARC, resist and topcoat are plotted. As can be seen the BARC and resist edges overlap so that this would result in a rejected substrate because of the increased risk of contamination. FIG. 12 shows another example in which there is no overlap between the edges which are also in the correct order so that the substrate would pass the test.

The results of analysis can be used in a feedback loop so that the process steps for applying at least one of the layers on a subsequent substrate is changed thereby to eliminate the overlap of edges.

The above mentioned method works just as well with two layers as opposed to three layers and can also be used by scanning only portions of the edge of the substrate as well as the whole way around the periphery of the edge. However, it is most efficient if the scanning is done at the same time as scanning of the top surface of the substrate for defects in which case the whole of the top surface of the substrate (or at least the whole surface in plan, covered by the BARC layer 100) is scanned.

An embodiment of the present invention, as discussed above, may also be used with phase shift and reflectometry techniques. In phase shift techniques the sampling phase shift is detected between successive lines of a multi-line sensor array during scanning. In reflectometry, the substrate may be illuminated separately by s-polarized radiation and p-polarized radiation impinging at near the Brewster angle of silicon or resist, and an image difference between the reflected s-polarized radiation and the reflected p-polarized radiation is derived.

The above described system can be used additionally or alternatively to detect residues on the substrate which could potentially contaminate the immersion liquid or components of the apparatus. Such residues may be particles of BARC which have chipped off, for example.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The immersion liquid used in the apparatus may have different compositions, according to the desired properties and the wavelength of exposure radiation used. For an exposure wavelength of 193 nm, ultra pure water or water-based compositions may be used and for this reason the immersion liquid is sometimes referred to as water and water-related terms such as hydrophilic, hydrophobic, humidity, etc. may be used.

The descriptions above are intended to be illustrative, not limiting. Thus, it will be apparent to one skilled in the art that modifications may be made to the invention as described without departing from the scope of the claims set out below.

The invention claimed is:

1. An inspection method comprising:
   directing a beam of electromagnetic radiation over substantially the whole top surface of a lithography substrate covered in first and second layers thereon and towards an edge of the layers that is proximate an edge of the lithography substrate, the whole top surface of the lithography substrate being substantially covered by both the first and the second layers;
   detecting scattered and/or reflected electromagnetic radiation; and
   establishing, from results of the detecting, whether an edge of the second layer proximate the edge of the lithography substrate overlaps an edge of the first layer proximate the edge of the lithography substrate.

2. The method of claim 1, wherein the edge of the first layer and the edge of the second layer are proximate an edge of the substrate.

3. The method of claim 1, wherein the directing comprises moving the position at which the beam impinges on the top surface such that substantially the whole top surface has had the beam impinging on it.

4. The method of claim 3, wherein the moving comprises a stepping or a scanning motion.

5. The method of claim 1, wherein the directing comprises covering substantially the whole periphery of the edge of the layers.

6. The method of claim 1, wherein the establishing further comprises establishing, from results of the detecting, a surface profile of the top surface of the lithography substrate.

7. The method of claim 1, wherein the establishing further comprises establishing, from results of the detecting, the presence or absence of defects in one or more of the layers.

8. The method of claim 1, further comprising generating a feedback signal, on the basis of the result of the establishing, for use by a machine for applying layers to a substrate.

9. The method of claim 1, wherein the establishing includes providing positional data of the edge of the layers in polar coordinates.

10. The method of claim 9, wherein the establishing further comprises fitting a curve to the positional data for each edge, the curve having the formula:

$$r = a + b \sin(\phi) + c \cos(\phi)$$

wherein r is a displacement from the origin and a, b and c are constants and $\phi$ is the radial position.

11. The method of claim 1, wherein the substrate has a third layer and the establishing establishes whether an edge of the third layer overlaps the edge of the first layer or the edge of the second layer.

12. The method of claim 1, wherein the beam is directed at an acute angle on the top surface of the lithography substrate.

13. A method of preparing a lithography substrate for lithography, the method comprising:
   first applying of a first coating to the lithography substrate, the first coating covering substantially the whole top surface of the lithography substrate;
   second applying of a second coating to the lithography substrate, the second coating covering substantially the whole top surface of the lithography substrate;
   scanning or stepping a beam of electromagnetic radiation over substantially the whole top surface of the lithography substrate covered in the first or second coating and along an edge of the first and/or second coating that is proximate an edge of the lithography substrate;
   detecting radiation reflected and/or scattered by the edge of the first coating and by the edge of the second coating; and
   from the detected radiation, establishing whether or not the edge of the first coating proximate the edge of the lithography substrate and the edge of the second coating proximate the edge of the lithography substrate overlap.

14. The method of claim 13, wherein, if the edge of the first coating and the edge of the second coating overlap, for a next lithography substrate, changing the first and/or second applying accordingly such that the edge of the first and second coatings of the next substrate do not overlap.

15. The method of claim 13, further comprising third applying of a third coating to the lithography substrate following the second applying.

16. The method of claim 15, wherein an edge of the third coating is located between the edge of the first coating and the edge of the second coating.

17. The method of claim 15, wherein the third coating is a topcoat.

18. The method of claim 13, wherein the first coating is a bottom anti-reflection coating.

19. The method of claim 13, wherein the second coating is a resist layer.

20. A device manufacturing method, comprising:
providing a lithography substrate prepared using the method comprising:
first applying of a first coating to the lithography substrate, the first coating covering substantially the whole top surface of the lithography substrate,
second applying of a second coating to the lithography substrate, the second coating covering substantially the whole top surface of the lithography substrate,
scanning or stepping a beam of electromagnetic radiation over substantially the whole top surface of the lithography substrate covered in the first or second coating and along an edge of the first and/or second coating that is proximate an edge of the lithography substrate,
detecting radiation reflected and/or scattered by the edge of the first coating and by the edge of the second coating, and
from the detected radiation, establishing whether or not the edge of the first coating proximate the edge of the lithography substrate and the edge of the second coating proximate the edge of the lithography substrate overlap; and
projecting a patterned beam of radiation onto the substrate.

* * * * *

UNITED STATES PATENT AND TRADEMARK OFFICE
CERTIFICATE OF CORRECTION

| | | |
|---|---|---|
| PATENT NO. | : 8,435,593 B2 | |
| APPLICATION NO. | : 11/802422 | |
| DATED | : May 7, 2013 | |
| INVENTOR(S) | : Rik Teodoor Vangheluwe et al. | |

It is certified that error appears in the above-identified patent and that said Letters Patent is hereby corrected as shown below:

On title page, Item (75) Inventors, Line 7
  replace "Thijs Egidius Johannes Knaapen, HD"
  with --Thijs Egidius Johannes Knaapen,--.

On title page, Item (75) Inventors, Line 9
  replace "Marinus Daverveld, EL Sint-Oedenrode"
  with --Marinus Daverveld, Sint-Oedenrode--.

Signed and Sealed this
Twenty-third Day of July, 2013

Teresa Stanek Rea
*Acting Director of the United States Patent and Trademark Office*